United States Patent
King

[11] Patent Number: 6,130,013
[45] Date of Patent: Oct. 10, 2000

[54] BIREFRINGENT INTERLAYER FOR ATTENUATING STANDING WAVE PHOTOEXPOSURE OF A PHOTORESIST LAYER FORMED OVER A REFLECTIVE LAYER

[75] Inventor: Mingchu King, Taichung, Taiwan

[73] Assignee: Taiwan Semiconductor Manufacturing Company, Hsin-Chu, Taiwan

[21] Appl. No.: 09/317,646

[22] Filed: May 24, 1999

Related U.S. Application Data

[62] Division of application No. 08/868,845, Jun. 9, 1997, Pat. No. 5,945,255.

[51] Int. Cl.[7] .................................................. G03E 5/00
[52] U.S. Cl. ................................................. 430/14; 430/950
[58] Field of Search .................................. 430/311, 313, 430/271.1, 950, 11, 14; 250/492.1, 492.2, 492.22; 428/446, 450, 452, 453, 454; 257/499, 618

[56] References Cited

U.S. PATENT DOCUMENTS

| | | | |
|---|---|---|---|
| 4,849,080 | 7/1989 | Doorman et al. | 204/192.15 |
| 5,547,813 | 8/1996 | Tsujita | 430/325 |
| 5,555,114 | 9/1996 | Narita et al. | 359/65 |
| 5,580,701 | 12/1996 | Lur et al. | 430/316 |
| 5,694,233 | 12/1997 | Wu et al. | 359/117 |
| 5,727,109 | 3/1998 | Pan | 385/140 |

FOREIGN PATENT DOCUMENTS

| | | |
|---|---|---|
| 7-234317 | 9/1995 | Japan . |
| 9409158 | 10/1994 | Rep. of Korea . |

OTHER PUBLICATIONS

Shiraishi, Kazuo, Fabrication of Spatial Walk–Off Polarizing Films by Oblique Deposition, IEEE Journal of Quantum Electronics, vol. 30, No. 10, pp. 2417–2420, Oct. 1994.

*Primary Examiner*—Kathleen Duda
*Attorney, Agent, or Firm*—George O. Saile; Stephen B. Ackerman; Alek P. Szecsy

[57] ABSTRACT

A method for attenuating within a microelectronics fabrication a standing wave photoexposure of a photoresist layer formed upon a reflective layer, and a microelectronics fabrication employed within the method. To practice the methods there is first provided a substrate employed within a microelectronics fabrication. There is then formed over the substrate a reflective layer. There is then formed upon the reflective layer a birefringent material layer. The birefringent material layer attenuates a standing wave photoexposure of a photoresist layer subsequently formed upon the birefringent material layer, where the photoresist layer is subsequently photoexposed with an actinic photoexposure radiation beam.

6 Claims, 3 Drawing Sheets

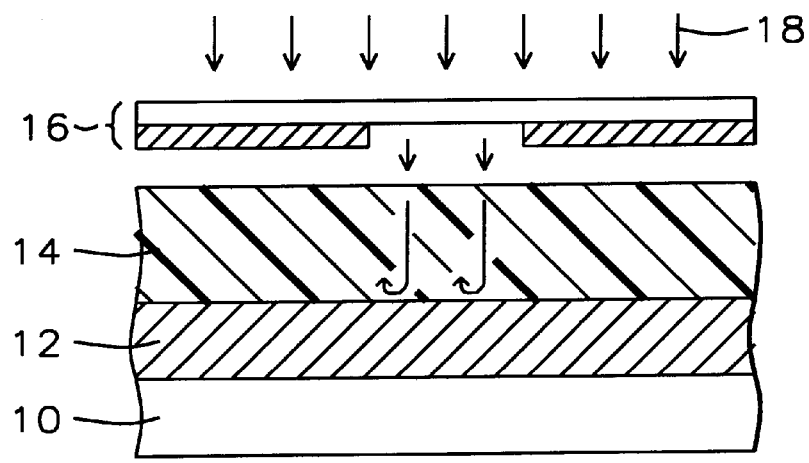
FIG. 1 – Prior Art
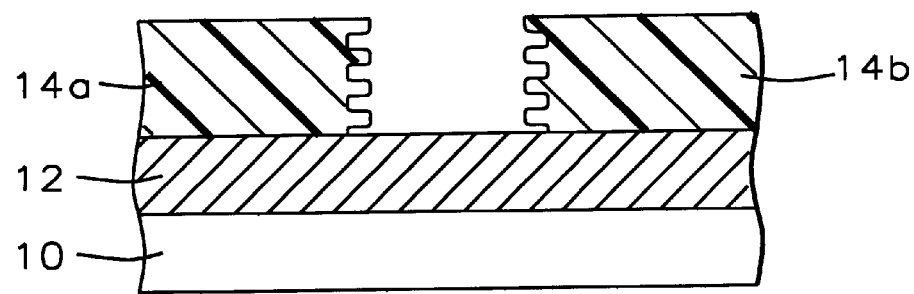
FIG. 2 – Prior Art

BIREFRINGENT INTERLAYER FOR ATTENUATING STANDING WAVE PHOTOEXPOSURE OF A PHOTORESIST LAYER FORMED OVER A REFLECTIVE LAYER

This is a division of patent application Ser. No. 08/868,845, filing date Jun. 9, 1997, now U.S. Pat. No. 5,945,255 issued Aug. 31, 1999 Birefringent Interlayer For Attenuating Standing Wave Photoexposure Of A Photoresist Layer Formed Over A Reflective Layer, assigned to the same assignee as the present invention.

BACKGROUND OF THE INVENTION

1. Field of the Invention

The present invention relates generally to photolithographic methods and materials employed within microelectronics fabrications. More particularly, the present invention relates to photolithographic methods and materials employed in attenuating standing wave photoexposures of photoresist layers formed upon reflective layers employed within microelectronics fabrications.

2. Description of the Related Art

Integrated circuit microelectronics fabrications are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit microelectronics fabrication technology has advanced and integrated circuit microelectronics fabrication device dimensions have decreased, several novel effects have become more pronounced within the methods and materials through which are formed advanced integrated circuit microelectronics fabrications. In particular, within the photolithographic methods and materials through which are formed patterned layers and patterned structures within advanced integrated circuit microelectronics fabrications, a significant novel effect which has evolved is the standing wave photoexposure effect by which actinic photoexposure radiation employed in photoexposing photoresist layers formed upon reflective layers within advanced integrated circuit microelectronics fabrications is reflected back from those reflective layers and into those photoresist layers in a fashion through which there is provided an inhomogeneous standing wave photoexposure of those photoresist layers. A pair of schematic cross-sectional diagrams illustrating the results of progressive stages in forming a pair of inhomogeneously standing wave photoexposed patterned photoresist layers upon a reflective layer within an advanced integrated circuit microelectronics fabrication is shown in FIG. 1 and FIG. 2.

Shown in FIG. 1 is a substrate 10 having formed thereover a blanket reflective layer 12 which in turn has formed thereupon a blanket photoresist layer 14. As shown within FIG. 1, the blanket photoresist layer 14 is photoexposed through a photoexposure reticle 16 while employing an actinic photoexposure radiation beam 18, where portions of the actinic photoexposure radiation beam 18 within the blanket photoresist layer 14 are reflected back from the surface of the blanket reflective layer 12 and into the blanket photoresist layer 14, thus yielding a standing wave photoexposure within the blanket photoresist layer 14.

Shown in FIG. 2 is the results of developing the photoexposed blanket photoresist layer 14 illustrated in FIG. 1.

Shown in FIG. 2 is a pair of standing wave photoexposed patterned photoresist layers 14a and 14b formed upon the blanket reflective layer 12, where due to the standing wave photoexposure of the blanket photoresist layer 14 the standing wave photoexposed patterned photoresist layers 14a and 14b have irregularly formed sidewalls. As is understood by a person skilled in the art, although FIG. 1 and FIG. 2 illustrate the blanket photoresist layer 14 and the pair of standing wave photoexposed patterned photoresist layers 14a and 14b as implicitly formed from a positive photoresist material, photoresist layers analogous to the blanket photoresist layer 14 as shown in FIG. 1 and the standing wave photoexposed patterned photoresist layers 14a and 14b as illustrated in FIG. 2 may also be formed when employing a blanket photoresist layer formed from a negative photoresist material. Standing wave photoexposed patterned photoresist layers, such as the pair of standing wave photoexposed patterned photoresist layers 14a and 14b as illustrated in FIG. 2, are undesirable within advanced integrated circuit microelectronics fabrications since there is often formed when employing those standing wave photoexposed patterned photoresist layers patterned integrated circuit layers and patterned integrated circuit structures with compromised dimensional integrity.

It is thus towards the goal of providing photolithographic methods and materials through which there may be attenuated standing wave photoexposures of photoresist layers formed upon reflective layers within microelectronics fabrications that the present invention is generally directed.

Various methods and materials have been disclosed in the arts of microelectronics fabrications for providing novel optical structures within microelectronics fabrications or for addressing novel optical considerations within microelectronics fabrications. For example, Doorman, et al., in U.S. Pat. No. 4,849,080 discloses a method for manufacturing an optical stripline waveguide for non-reciprocal optical components within microelectronics fabrications. The method employs forming a surface lattice disordered waveguide strip material surrounded by an iron garnet cladding material, where the iron garnet cladding material has an index of refraction less than the index of refraction of the surface lattice disordered waveguide strip material.

In addition, Tsujita, in U.S. Pat. No. 5,547,813, discloses a method for forming within a microelectronics fabrication a fine photoresist pattern of high resolution while employing a contrast enhancement layer. The method employs a spacer layer of index of refraction 1.3 to 1.4 separating the contrast enhancement layer from a photoresist layer from which is formed the fine photoresist pattern, where the thicknesses of the contrast enhancement layer and the spacer layer are further co-specified.

Most pertinent to the present invention, however, is Lur et al., U.S. Pat. No. 5,580,701, who disclose a method for eliminating a standing wave effect when photoexposing a photoresist layer formed upon a reflective layer within a microelectronics fabrication. The method employs an anti-reflective interference stack layer interposed between the photoresist layer and the reflective layer, where the relative indices of refraction of the materials from which are formed the photoresist layer, the anti-reflective interference stack layer and the reflective layer are further co-specified.

Desirable in the art are additional photolithographic methods and materials through which inhomogeneous standing wave photoexposures of photoresist layers formed upon reflective layers within microelectronics fabrications, such as but not limited to integrated circuit microelectronics fabrications, may be attenuated. It is towards this goal that the present invention is more specifically directed.

SUMMARY OF THE INVENTION

A first object of the present invention is to provide a photolithographic method for attenuating within a microelectronics fabrication an inhomogeneous standing wave photoexposure of a photoresist layer formed upon a reflective layer.

A second object of the present invention is to provide a method in accord with the first object of the present invention, where the microelectronics fabrication is an integrated circuit microelectronics fabrication.

In accord with the objects of the present invention there is provided by the present invention a method for attenuating within a microelectronics fabrication an inhomogeneous standing wave photoexposure of a photoresist layer formed upon a reflective layer. To practice the method of the present invention, there is first provided a substrate employed within a microelectronics fabrication. There is then formed over the substrate a reflective layer. There is then formed upon the reflective layer a birefringent material layer. Finally, there is formed upon the birefringent material layer a photoresist layer which is subsequently photoexposed employing an actinic photoexposure radiation beam.

The present invention provides a photolithographic method for attenuating within a microelectronics fabrication an inhomogeneous standing wave photoexposure of a photoresist layer formed upon a reflective layer. The method of the present invention realizes this object by employing a birefringent material layer formed interposed between the photoresist layer and the reflective layer within the microelectronics fabrication.

The present invention may be employed where the microelectronics fabrication is an integrated circuit microelectronics fabrication. The method of the present invention does not discriminate with respect to the nature of the microelectronics fabrication within which is formed the photoresist layer, the birefringent material layer and the reflective layer. Thus, although the method of the present invention is more likely to provide value for advanced integrated circuit microelectronics fabrications which employ diminished dimensions, the method of the present invention may be employed within microelectronics fabrications including but not limited to integrated circuit microelectronics fabrications, solar cell microelectronics fabrications, ceramic packaging microelectronics fabrications and flat panel display microelectronics fabrications.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a pair of schematic cross-sectional diagrams illustrating the formation of a pair of inhomogeneously standing wave photoexposed patterned photoresist layers upon a reflective layer within a microelectronics fabrication in accord with a method conventional in the art of microelectronics fabrication.

DESCRIPTION OF THE PREFERRED EMBODIMENT

The present invention provides a method for attenuating within a microelectronics fabrication an inhomogeneous standing wave photoexposure of a photoresist layer formed upon a reflective layer. The method of the present invention realizes this object by forming interposed between the photoresist layer and the reflective layer a birefringent material layer.

Although the preferred embodiment of the method of the present invention illustrates the method of the present invention employed in attenuating an inhomogeneous standing wave photoexposure of a blanket photoresist layer formed upon a blanket reflective conductor layer within an integrated circuit microelectronics fabrication, the method of the present invention may alternatively be employed in attenuating inhomogeneous standing wave photoexposures within photoresist layers formed upon reflective layers other than reflective conductor layers within microelectronics fabrications other than integrated circuit microelectronics fabrications. In that regard, the method of the present invention may be employed in attenuating inhomogeneous standing wave photoexposures within photoresist layers formed upon reflective layers including but not limited to reflective conductor layers, reflective semiconductor layers and reflective insulator layers formed within microelectronics fabrications including but not limited to integrated circuit microelectronics fabrications, solar cell microelectronics fabrications, ceramic packaging microelectronics fabrications and flat panel display microelectronics fabrications.

Similarly, as is also understood by a person skilled in the art, although the preferred embodiment of the method of the present invention illustrates the method of the present invention employed in attenuating within an integrated circuit microelectronics fabrication a standing wave photoexposure of a blanket photoresist layer formed upon a blanket reflective conductor layer, the method of the present invention will also in general attenuate standing wave reflections from surfaces of reflective layers employed within microelectronics fabrications independent of the presence or absence of a photoresist layer formed upon the reflective layer.

Figure 3:
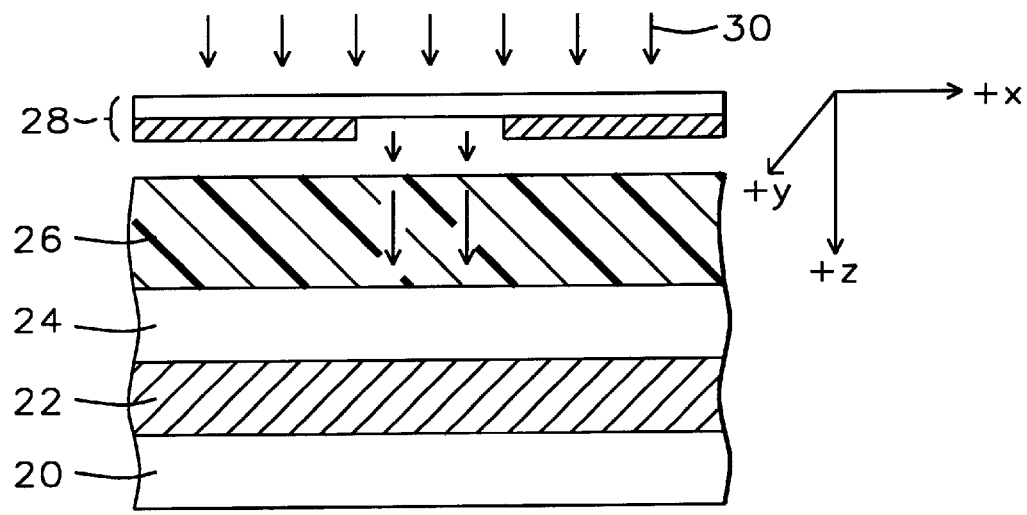
FIG. 3 to FIG. 5 show a series of schematic cross-sectional diagrams illustrating the results of progressive stages in forming within an integrated circuit microelectronics fabrication a pair of patterned reflective conductor layers while attenuating an inhomogeneous standing wave photoexposure of a photoresist layer employed as an etch mask in forming the pair of patterned reflective conductor layers, in accord with a preferred embodiment of the method of the present invention.

Referring now to FIG. 3, there is shown a schematic cross-sectional diagram of an integrated circuit microelectronics fabrication within which there is attenuated an inhomogeneous standing wave photoexposure within a blanket photoresist layer formed over a blanket reflective conductor layer in accord with a preferred embodiment of a method in accord with the present invention.

Shown in FIG. 3 is a substrate 20 having formed thereover a blanket reflective conductor layer 22. The blanket reflective conductor layer 22 in turn has formed thereupon a blanket birefringent material layer 24. Finally, the blanket birefringent material layer 24 has formed thereupon a blanket positive photoresist layer 26.

Although semiconductor substrates are known in the art of integrated circuit microelectronics fabrication with either dopant polarity, several dopant concentrations and various crystallographic orientations, for the preferred embodiment of the method of the present invention, the substrate 20 preferably comprises a (100) silicon semiconductor substrate having a N- or P-doping. The substrate 20 also preferably comprises several other conductor layers, semiconductor layers and/or dielectric layers which are typically formed upon semiconductor substrates employed in forming integrated circuit microelectronics fabrications. Although not specifically illustrated in FIG. 3, the substrate 20 also preferably comprises formed therein and/or thereupon electrical circuit elements, such as but not limited to transistors, resistors, capacitors and diodes, which are also similarly conventionally employed within integrated circuit microelectronics fabrications.

Similarly, although it is also known in the art of integrated circuit microelectronics fabrication that conductor layers may be formed through methods and materials including but not limited to thermally assisted evaporation methods, electron beam assisted evaporation methods, chemical vapor deposition (CVD) methods and physical vapor deposition (PVD) sputtering methods through which may be formed conductor layers of conductor materials including but not limited to metals, metal alloys, highly doped polysilicon and polycides (highly doped polysilicon-metal silicide stacks), for the preferred embodiment of the method of the present invention the blanket reflective conductor layer 22 is typically and preferably formed at least in part of an aluminum containing conductor material, as is most common in the art of integrated circuit microelectronics fabrication. Typically and preferably, the blanket reflective conductor layer 22 is formed to a thickness of from about 2000 to about 10000 angstroms. Typically and preferably, the blanket reflective conductor layer 22 has a reflectivity of greater than about 50 percent at a wavelength of an actinic photoexposure radiation beam subsequently employed in photoexposing the blanket photoresist layer 26.

In addition, while it is also known in the art of integrated circuit microelectronics fabrication that photoresist layers may be formed from any of several photoresist materials chosen from the general groups of photoresist materials including but not limited to positive photoresist materials and negative photoresist materials, the preferred embodiment of the method of the present invention illustrates the method of the present invention practiced employing the blanket photoresist layer 26 formed of a positive photoresist material. Functionally equivalent structures may, however, also be formed in accord with the method of the present invention when employing a blanket photoresist layer, such as the blanket photoresist layer 26, formed of a negative photoresist material. Preferably, the blanket photoresist layer 26 is formed to a thickness of from about 8000 to about 19000 angstroms.

Also shown in FIG. 3 is a photoexposure reticle 28 positioned above the blanket photoresist layer 26, and an actinic photoexposure radiation beam 30 photoexposing a portion of the blanket photoresist layer 26 exposed through the photoexposure reticle 28. In contrast with the blanket photoresist layer 14 a portion of which is photoexposed with the actinic photoexposure radiation beam 18 through a method conventional in the art of microelectronics fabrication as illustrated in FIG. 1 and FIG. 2, there is substantially attenuated within FIG. 3 reflection of the actinic photoexposure radiation beam 30 back into to blanket photoresist layer 26 from the blanket reflective conductor layer 22, due to the presence within FIG. 3 of the birefringent material layer 24. Thus, within the preferred embodiment of the method of the present invention there is attenuated a standing wave photoexposure of the blanket photoresist layer 26.

In order to provide optimal performance of the method of the present invention, there are several parameters pertaining to the structure whose schematic cross-sectional diagram is illustrated in FIG. 3, and in particular to the blanket birefringent material layer 24 within the structure whose schematic cross-sectional diagram is illustrated in FIG. 3, for which parameters there are limits which are preferably controlled. In that regard, within the preferred embodiment of the method of the present invention, the blanket birefringent material layer 24 is chosen to exhibit a birefringence in a plane perpendicular to a z-direction plane of the actinic photoexposure radiation beam 30 as illustrated in FIG. 3. Thus, the blanket birefringent material layer 24 has a first real index of refraction in an x-direction plane perpendicular to the z-direction plane, the first real index of refraction being denoted as $n_{bx}$, and the blanket birefringent material layer 24 also has a second real index of refraction in a y-direction plane perpendicular to both the x-direction plane and the z-direction plane, the second real index of refraction being denoted as $n_{by}$. Preferably, the maximum difference in the first real index of refraction of the material from which is formed the blanket birefringent material layer 24 in the x-direction plane perpendicular to the z-direction plane, $n_{bx}$, and the second real index of refraction of the material from which is formed the blanket birefringent material layer 24 in the y-direction plane perpendicular to the x-direction plane and the z-direction plane, $n_{by}$, is preferably greater than about 0.1. Similarly, for the preferred embodiment of the method of the present invention the actinic photoexposure radiation beam 30 is formed of circularly polarized light, as is common within microelectronics fabrication. Finally, it is also preferred within the method of the present invention that a thickness $L_b$ of the blanket birefringent material layer 24 is approximately equal to the quantity ¼ $|(\lambda/(n_{bx}-n_{by}))|$, where $\lambda$ equals the wavelength of the actinic photoexposure radiation beam 30, although the method of the present invention will still provide value in attenuating a standing wave photoexposure of a photoresist layer, such as the blanket photoresist layer 26, when the thickness $L_b$ of the blanket birefringent material layer 24 is within a range of from about ⅛ $|(\lambda/(n_{bx}-n_{by}))|$ to about ⅜ $|(\lambda/(n_{bx}-n_{by}))|$.

Figure 4:
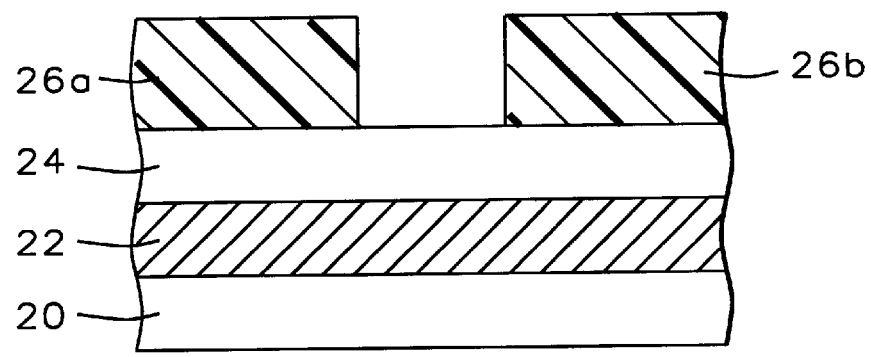

Referring now to FIG. 4, there is shown a schematic cross-sectional diagram illustrating the results of further processing of the integrated circuit microelectronics fabrication whose schematic cross-sectional diagram is illustrated in FIG. 3. Shown in FIG. 4 is a schematic cross-sectional diagram of an integrated circuit microelectronics fabrication otherwise equivalent to the integrated circuit microelectronics fabrication whose schematic cross-sectional diagram is illustrated in FIG. 3, but wherein the blanket photoresist layer 26 after having been photoexposed through the photoexposure reticle 28 with the actinic photoexposure radiation beam 30 has been developed to form the patterned photoresist layers 26a and 26b formed upon the blanket birefringent material layer 24. In contrast with the standing wave photoexposed patterned photoresist layers 14a and 14b formed upon the blanket reflective layer 12 through the method conventional in the art of microelectronics fabrication as illustrated in FIG. 2, the patterned photoresist layers 26a and 26b formed upon the blanket birefringent material layer 24 and over the blanket reflective conductor layer 22 as illustrated in FIG. 4 are formed with straight sidewalls rather than irregular sidewalls.

Figure 5:
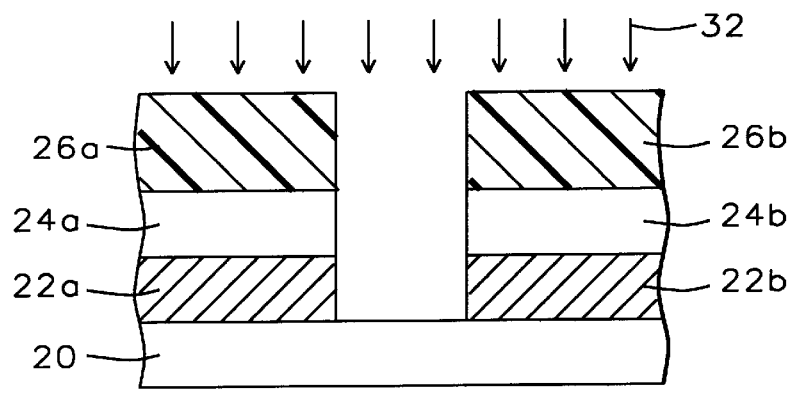

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication corresponding with the integrated circuit microelectronics fabrication whose schematic cross-sectional diagram is illustrated in FIG. 4, but wherein there has sequentially: (1) been formed from the blanket birefringent material layer 24 the patterned birefringent material layers 24a and 24b; and (2) been formed from the blanket reflective conductor layer 22 the patterned reflective conductor layers 22a and 22b, through etching within a plasma 32 while employing the patterned photoresist layers 26a and 26b as patterned photoresist etch mask layers. Within the preferred embodiment of the method of the present invention, the plasma 32 preferably employs an etchant gas composition, or a sequence of etchant gas compositions, appropriate to the materials from which are formed the blanket birefringent material layer 24 and the blanket reflective conductor layer 22. As is illustrated in FIG. 5, the patterned birefringent material layers 24a and 24b and the patterned reflective conductor layers 22a and 22b are formed with dimensional integrity and straight sidewalls since the patterned photoresist layers 26a and 26b are formed with an attenuated standing wave photoexposure, thus yielding patterned photoresist layers with straight sidewalls.

As is understood by a person skilled in the art the patterned photoresist layers 26a and 26b and the patterned birefringent material layers 24a and 24b may be subsequently stripped from the integrated circuit microelectronics fabrication whose schematic cross-sectional diagram is illustrated in FIG. 5 to yield an integrated circuit microelectronics fabrication which may subsequently be fabricated to completion with additional layers and structures formed through methods and materials as are conventional in the art of integrated circuit microelectronics fabrication.

EXAMPLE

The following is a prophetic example through which there is calculated actinic photoexposure radiation power as a function of depth z within the z-direction (ie: P (z)) within a photoresist layer formed upon a birefringent material layer which in turn is formed upon a reflective conductor layer in accord with the preferred embodiment of the method of the present invention.

Within the prophetic example, the reflective conductor layer, which corresponds with the blanket reflective conductor layer 22 as illustrated in FIG. 3, has a complex index of refraction $n_4'$ which equals a difference between a real index of refraction $n_4$ and an imaginary index of refraction $K_4$ (ie: $n_4'=n_4-j\kappa_4$), where j equals $\sqrt{-1}$. The reflective conductor layer also has a permittivity $\epsilon_4$ and a permeability $\mu_4$. Similarly, within the prophetic example, the birefringent material layer, which corresponds with the blanket birefringent material layer 24 as illustrated in FIG. 3, has: (1) a complex index of refraction in the x-direction $n_{3x}'$ which equals a difference between a real index of refraction in the x-direction $n_{3x}$ and an imaginary index of refraction in the x-direction $\kappa_{3x}$ (ie: $n_{3x}'=n_{3x}-j\kappa_{3x}$); and (2) a complex index of refraction in the y-direction $\kappa_{3y}'$ which equals a difference between a real index of refraction in the y-direction $n_{3y}$ and an imaginary index of refraction in the y-direction $\kappa_{3y}$ (ie: $n_{3y}'=n_{3y}-j\kappa_{3y}$). The birefringent material layer also has a permittivity $\epsilon_3$ and a permeability $\mu_3$. In addition, within the prophetic example, the photoresist layer, which corresponds with the blanket photoresist layer 26 as illustrated in FIG. 3, has a complex index of refraction $n_2'$ which equals a difference between a real index of refraction $n_2$ and an imaginary index of refraction $\kappa_2$ (ie: $n_2'=n_2-j\kappa_2$). The photoresist layer also has a permittivity $\epsilon_2$ and a permeability $\mu_2$. Finally, within the prophetic example, an actinic photoexposure radiation beam, which corresponds with the actinic photoexposure radiation beam 30 as illustrated in FIG. 3, travels through air when impinging upon the photoresist layer, where air has a complex index of refraction $n_1'$ which equals a difference between a real index of refraction $n_1$ plus an imaginary index of refraction $\kappa_1$ (ie: $n_1'=n_1-j\kappa_1$). Air also has a permittivity $\epsilon_1$ and a permeability $\mu_1$.

Within the prophetic example, the thickness of the birefringent layer is denoted as $L_b$ and the thickness of the photoresist layer is denoted as $L_p$. The thickness of the reflective conductor layer is assumed to be finite and therefore also assumed to be semi-infinite. In addition, within the prophetic example, the wavelength of the actinic photoexposure radiation beam is denoted as $\lambda$ and the actinic photoexposure radiation beam is assumed to have a normal incidence to the photoresist layer. Similarly, within the prophetic example, there exists: (1) a reflection coefficient of the actinic photoexposure radiation beam from within the photoresist layer at the air-photoresist layer interface, denoted as $r_{21}$; (2) an effective reflection coefficient of the actinic photoexposure radiation beam from within the photoresist layer in the x-direction at the photoresist layer-birefringent material layer interface, denoted as $\text{reff}_{23x}$; (3) an effective reflection coefficient of the actinic photoexposure radiation beam from within the photoresist layer in the y-direction at the photoresist layer-birefringent material layer interface, denoted as $\text{reff}_{23y}$; and (4) a transmission coefficient of the actinic photoexposure radiation beam into the photoresist layer at the air-photoresist material layer interface, denoted as $t_{12}$.

In the process of calculating the actinic photoexposure radiation beam power within the photoresist layer as a function of distance z within the z-direction within the photoresist layer there is first determined an intrinsic optical impedance $\eta_i$ for each of air, the photoresist layer, the birefringent material layer and the reflective conductor layer, in accord with equation 1, $$\eta_i = \sqrt{(\mu_i/\epsilon_i)} = c\mu_i/n_i' \tag{1}$$

where $\eta_i$ equals the intrinsic optical impedance of the pertinent material, $\mu_i$ equals the permeability of the pertinent material, $\epsilon_i$ equals the permittivity of the pertinent material and c equals the speed of light in free space.

There is then also calculated: (1) the wavenumber of the actinic photoexposure radiation beam within the within the photoresist layer, denoted as $k_2$; (2) the wavenumber of the actinic photoexposure radiation beam in the x-direction within the birefringent material layer, denoted as $k_{3x}$; and, (3) the wavenumber of the actinic photoexposure radiation beam in the y-direction within the birefringent material layer, denoted as $k_{3y}$, in accord with equations 2, equation 3 or equation 4.

$$k_2 = 2\pi n_2'/\lambda \tag{2}$$

$$k_{3x} = 2\pi n_{3x}'/\lambda \tag{3}$$

$$k_{3y} = 2\pi n_{3x}'/\lambda \tag{4}$$

There is then also calculated the optical impedance at the photoresist layer-birefringent material layer interface as determined for the actinic photoexposure radiation beam incident in the positive z-direction. The optical impedance at the photoresist layer-birefringent material layer interface is determined, looking into the positive z-direction for x-polarized light, and denoted as $Z_{3x}$, in accord with equation 5. The optical impedance at the photoresist layer-birefringent material layer interface is also determined, looking into the positive z-direction for y-polarized light, and denoted as $Z_{3y}$, in accord with equation 6.

$$Z_{3x}=\eta_{3x}((\eta_4+j\eta_{3x}\tan(k_{3x}L_b))/(\eta_{3x}+j\eta_4\tan(k_{3x}L_b))) \quad (5)$$

$$Z_{3y}=\eta_{3y}((\eta_4+j\eta_{3y}\tan(k_{3y}L_b))/(\eta_{3y}+j\eta_4\tan(k_{3y}L_b))) \quad (6)$$

There is then calculated: (1) the reflection coefficient of the actinic photoexposure radiation beam from within the photoresist layer at the air-photoresist layer interface, denoted as $r_{21}$; (2) the effective reflection coefficient of the actinic photoexposure radiation beam from within the photoresist layer in the x-direction at the photoresist layer-birefringent material layer interface, denoted as $\mathrm{reff}_{23x}$; (3) the effective reflection coefficient of the actinic photoexposure radiation beam from within the photoresist layer in the y-direction at the photoresist layer-birefringent material layer interface, denoted as $\mathrm{reff}_{23y}$; and (4) the transmission coefficient of the actinic photoexposure radiation beam into the photoresist layer at the air-photoresist material layer interface, denoted as $t_{12}$, in accord with equation 7, equation 8, equation 9 or equation 10.

$$\mathrm{reff}_{23x}=(Z_{3x}-\eta_2)/(Z_{3x}+\eta_2) \quad (7)$$

$$\mathrm{reff}_{23y}=(Z_{3y}-\eta_2)/(Z_{3y}+\eta_2) \quad (8)$$

$$r_{21}=(\eta_1-\eta_2)/(\eta_1+\eta_2) \quad (9)$$

$$t_{12}=2\eta_2/(\eta_1+\eta_2) \quad (10)$$

Assuming that the incident photoexposure light is circularly polarized right handed, the electric field amplitude of the actinic photoexposure radiation beam in the x-direction at a distance z within the z-direction of the photoresist layer at time t=0, denoted as $E_x(z,t)$, is calculated in accord with equation 11 and the electric field amplitude of the actinic photoexposure radiation beam in the y-direction at a distance z within the z-direction of the photoresist layer at time t=0, denoted as $E_y(z,t)$, is calculated in accord with equation 12. Within equation 11 and equation 12, $E_0'$ equals the complex electric field amplitude of the incident actinic photoexposure light radiation beam (Re and Im are the real and imaginary parts thereof) and m equals an integer (ie: m=0, 1, 2 . . . ).

$$E_x(z,t=0)=\mathrm{Re}\{E_0'[(_{m=0,\infty}\Sigma t_{12}\exp(-jk_2z)(r_{21}\mathrm{reff}_{23x}\exp(-2jk_2L_p))^m)+ (_{m=0,\infty}\Sigma t_{12}\mathrm{reff}_{23x}$$
$$\exp(-jk_2(2L_p-z))(r_{21}\mathrm{reff}_{23x}\exp(-2jk_2L_p))^m)]\}=\mathrm{Re}\{E_0't_{12}(\exp(-jk_2z)+\mathrm{reff}_{23x}\exp(-jk_2(2L_p-z))/(1-r_{21}\mathrm{reff}_{23x}\exp(-2jk_2L_p))\} \quad (11)$$

$$E_y(z,t=0)=\mathrm{Im}\{-jE_0't_{12}(\exp(-jk_2z)+\mathrm{reff}_{23y}\exp(-jk_2(2L_p-z))/(1-r_{21}\mathrm{reff}_{23y}\exp(-2jk_2L_p))\} \quad (12)$$

The actinic photoexposure radiation power at a distance z in the z-direction within the photoresist layer is related to the foregoing amplitudes of the electric fields at the distance z in the z-direction within the photoresist layer by equation 13.

$$P(z,t) E_x^2(z,t)+E_y^2(z,t) \quad (13)$$

Figure 6:
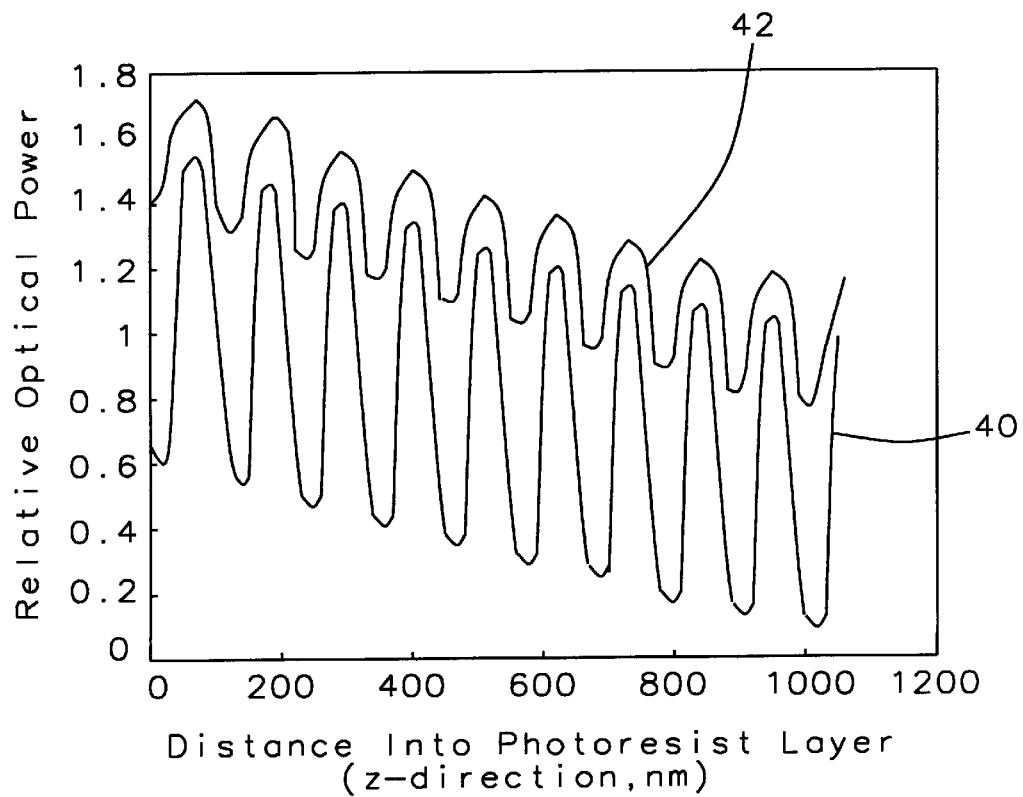
FIG. 6 shows a graph of Relative Optical Power versus Distance Into Photoresist Layer determined through a prophetic computer simulation for attenuating standing wave photoexposure of a photoresist layer formed upon a reflective layer in accord with the preferred embodiment of the method of the present invention.

Shown in FIG. 6 is a graph of actinic photoexposure radiation power as a function of distance z within the z-direction of the photoresist layer. Within the calculation there has been assumed: (1) air at a real index of refraction $n_1$ of 1, an imaginary index of refraction $\kappa_1$ of 0, a permittivity $\epsilon_1$ of 8.854E-12 F/m (equal to $\epsilon_0$) and a permeability $\mu_1$ of 4πE-7 H/m (equal to $\mu_0$); (2) the photoresist layer having a real index of refraction $n_2$ of 1.61, an imaginary index of refraction $\kappa_2$ of 0.0227, a permittivity $\epsilon_2$ of $(2.5916-0.0731j)\epsilon_0$ and a permeability $\mu_2$ of $\mu_0$; (3) a calcite birefringent material layer having a real index of refraction in the x-direction $n_{3x}$, of 1.493, an imaginary index of refraction in the x-direction $\kappa_{3x}$ of 0, a real index of refraction in the y-direction $n_{3y}$ of 1.673, an imaginary index of refraction in the y-direction $\kappa_{3y}$ of 0, a permittivity $\epsilon_3$ of $2.7989\epsilon_0$ and a permeability $\mu_3$ of $\mu_0$; and (4) a reflective conductor layer having a real index of refraction $n_4$ of 1.27, an imaginary index of refraction $\kappa_4$ of 1.95, a permittivity $\epsilon_4$ of $(-2.1896-4.9530j)\epsilon_0$ (calculated as $\epsilon_4=\epsilon_0(n_4)^2$) and a permeability $\mu_4$ of $\mu_0$.

The calculation employed in providing the graph of FIG. 6 also assumed a thickness of the photoresist layer of 1.075 microns and an actinic photoexposure radiation beam wavelength λ of 365 nanometers. Finally, the calculation also employed a thickness of the calcite birefringent material layer $L_b=¼ |(\lambda/(n_{3x}-n_{3y}))|$, although calculations employing a thickness of the birefringent material layer between about ⅛ and about ⅜ times the quantity of $|(\lambda/(n_{3x}-n_{3y}))|$ also provide graphs illustrating similar advantages to the advantages as illustrated within the graph of FIG. 6.

As shown in the graph of FIG. 6, there is a curve 40 which corresponds with the optical power of the actinic photoexposure radiation beam as a function of distance z within the z-direction of the photoresist layer without the presence of the birefringent material layer. Similarly, there is also shown in the graph of FIG. 6 a curve 42 which corresponds with the optical power of the actinic photoexposure radiation beam as a function of distance z within the z-direction of the photoresist layer with the presence of the birefringent material layer. As is seen through comparison of the curve 40 with the curve 42, there is obtained through the method of the present invention a substantial attenuation of a standing wave photoexposure of the photoresist layer with the actinic photoexposure radiation beam by forming interposed between the photoresist layer and the reflective conductor layer the birefringent material layer in accord with the method of the present invention.

Although not particularly common in the art of microelectronics fabrication, methods through which birefringent layers may be formed within other thin film fabrications, such as but not limited to thin film magnetic memories and liquid crystal displays, have been disclosed in the pertinent arts. See, for example, Shiraishi et al., "Fabrication of Spatial Walk-Off Polarizing Films by Oblique Deposition," IEEE Journal on Quantum Electronics, vol. 30(10), October 1994, pp. 2417–20. Such novel methods are not precluded for use within microelectronics fabrications.

Specifically, Shiraishi et al. disclose that birefringent layers are known to be formed from calcite and rutile crystal materials. In addition, Shiraishi et al. also disclose an oblique deposition method which may be employed for forming birefringent material layers. The oblique deposition method provides birefringent material layers which are formed of slanted micro-columns of higher index of refraction materials (preferably of index of refraction greater than about 2) which are separated by micro-voids (which typically have an index of refraction of about 1). Specific examples of such obliquely deposited birefringent material layers which have been reduced to practice employ micro-columns formed of tantalum oxide, although prophetic examples employing micro-columns formed of silicon are also disclosed.

What is claimed is:

1. A microelectronics fabrication comprising:
   a substrate employed within a microelectronics fabrication;
   a reflective layer formed upon the substrate;
   a birefringent material layer formed upon the reflective layer; and
   a photoresist layer formed upon the birefringent material layer.

2. The microelectronics fabrication of claim 1 wherein the microelectronics fabrication is chosen from the group of microelectronics fabrications consisting of integrated circuit microelectronics fabrications, solar cell microelectronics fabrications, ceramic packaging microelectronics fabrications and flat panel display microelectronics fabrications.

3. The microelectronics fabrication of claim 1 wherein the reflective layer is chosen from the group of reflective layers consisting of reflective conductor layers, reflective semiconductor layers and reflective dielectric layers.

4. The microelectronics fabrication of claim 1 wherein the birefringent material layer has a thickness of from $1/8$ to $3/8$ the quantity $|\lambda/(n_x-n_y)|$, wherein:
   $\lambda$ equals a wavelength of light whose standing wave reflection is attenuated in a z-direction orthogonal to the reflective layer;
   $n_x$ equals a real index of refraction of the birefringent material layer in an x-direction orthogonal to the z-direction; and
   $n_y$ equals a real index of refraction of the birefringent material layer in a y-direction orthogonal to the z-direction and the x-direction.

5. The microelectronics fabrication of claim 4 wherein the wavelength of light is a wavelength of circularly polarized light.

6. The microelectronics fabrication of claim 1 wherein the birefringent material layer is a single component birefringent material layer.

* * * * *